(12) United States Patent
Chen et al.

(10) Patent No.: US 7,819,686 B2
(45) Date of Patent: Oct. 26, 2010

(54) BURN-IN SOCKET

(75) Inventors: Ke-Hao Chen, Tu-Cheng (TW); Wen-Yi Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/538,877

(22) Filed: Aug. 11, 2009

(65) Prior Publication Data

US 2010/0035447 A1    Feb. 11, 2010

(30) Foreign Application Priority Data

Aug. 11, 2008    (TW) .............................. 97214366 U

(51) Int. Cl.
*H01R 12/00*    (2006.01)
(52) U.S. Cl. ...................................................... 439/330
(58) Field of Classification Search ................... 439/73, 439/70, 330, 331, 525, 526
See application file for complete search history.

(56) References Cited

U.S. PATENT DOCUMENTS

| 6,739,894 | B2 * | 5/2004 | Ogura ......................... 439/330 |
| 7,165,978 | B2 * | 1/2007 | Sato et al. ...................... 439/73 |
| 7,247,042 | B2 * | 7/2007 | Matsuo et al. ............... 439/330 |
| 7,491,082 | B2 * | 2/2009 | Hsu et al. .................... 439/330 |
| 2004/0248435 | A1 * | 12/2004 | Sato et al. ...................... 439/73 |
| 2006/0228916 | A1 * | 10/2006 | Sato et al. ...................... 439/73 |

* cited by examiner

*Primary Examiner*—Neil Abrams
*Assistant Examiner*—Phuong Nguyen
(74) *Attorney, Agent, or Firm*—Andrew C. Cheng; Wei Te Chung; Ming Chieh Chang

(57) ABSTRACT

A burn-in socket, for electrically connecting an IC package to a print circuit board, includes a base, a lid assembled upon the base and being movable up and down relative to the base and a latch pivotally linking to the base by a first shaft thereof. The latch defines a through hole which receives a second shaft pivotally linking to the lid. When being brought by the lid, the second shaft moves up and down in the through hole and drives the latch to rotate.

18 Claims, 6 Drawing Sheets

BURN-IN SOCKET

BACKGROUND OF THE INVENTION

1. Field of the Invention

The present invention relates to a burn-in socket for testing IC packages.

2. Description of the Related Art

Electronic packages, such as integrated circuits (IC) packages, are miniaturized electronic devices in which a number of active and passive circuit elements are located on or within a continuous body of material to perform the function of a complete circuit. To ensure reliability in use, the IC packages require prior burning in to test their durability. The IC packages are operated at a high temperature for an extended period of time to accelerate potential failure points. This helps eliminate early product failures once the IC packages are sold and/or assembled onto electronic end products. Thus, a burn-in socket is used to receive the IC package therein, and to electrically connect the IC package with a burn-in board for operation of the IC package at a high temperature.

U.S. Pat. No. 7,491,082 disclosed a related socket 1' shown in FIG. 1, the socket 1' comprises a base 2', a sliding plate 3' located above the base 2', a top board 4' fastened to the sliding plate 3' and a plurality of contacts (not shown) received in the base 2' and the sliding plate 3', a pair of pressing board 6' linking with the base and being capable of moving up and down relative to the base 2', two latches 5' pivotally assembled to two sides of the base 2' and a fastener located on the bottom of the base 2'. The fastener includes a fastening board 8' and a bottom board 7' located above the fastening board 8'.

The pressing board 6' is plane-like, and comprise a first surface 63', a second surface 64' opposite to the first surface 63' and a pair of pressing portions 65' protruding downwardly from a middle of the second surface 64' and engaging with the latch 5'. The latch 5' is assembled in a slot 23' of the base 2' and has a retaining portion 51' and a latching portion 52' extending upwardly from the retaining portion 51'. The retaining portion 51' has a shaft 511' retaining the retaining portion 51' in the slot 23 of the base 2'. The latch 5' further has a spring (not shown) located under the latch 5' for urging the latch 5' to close. The retaining portion 51' has a loading portion 512' with an oblique surface for being actuated by the pressing board 6'.

When assembly, the top board 4' is fixed to the sliding plate 3', then the sliding plate 3' and the top board 4' are mounted on a top surface of the base 2', the contacts (not shown) are mounted in the base 2' and the sliding plate 3', and after that the latches 5' are assembled to the bottom of the base 2' and located on two sides of the base 2', finally the pressing boards 6' are mounted on the base 2'. The pressing boards 6' are located at same sides with the latches 5'. The pressing board 6' moves downwardly when an operating force is applied on the first surface 63', and the pressing portion 65' then presses the latch 5'. Therefore, the latch 5' rotates to open against the spring (not shown), and to permit a loading of the IC package being seated into the socket 1' for testing. When the operating force is released from the pressing board 6', the pressing board 6' will return to an initial position by the operation of some coil springs, and the latch 5' rotates back.

However, when the pressing board 6' forces the latch 5', the spring (not shown) will be compressed and bring a counter-force, that causes the operation force correspondingly increases, and a trace of the latch. 5' can not be easily controlled. Furthermore, the spring (not shown) also occupies a certain room under the shaft 511'.

Hence, it is required to improve the disadvantages of the above socket.

SUMMARY OF THE INVENTION

An object of the invention is to provide a socket which can reliably control a moving process of a latch of the socket.

To achieve the above-mentioned object, a burn-in socket, for electrically connecting an IC package to a printed circuit board, comprises a base for receiving the IC package, a lid assembled upon the base and being movable relative to the base, and a latch. The latch has a first shaft pivotally linking to the base and a second shaft pivotally linking to the lid, the latch defines a through hole receiving the second shaft, when the lid moves up and down relative to the base, the second shaft is brought to move along the through hole and forcing the latch to rotate.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
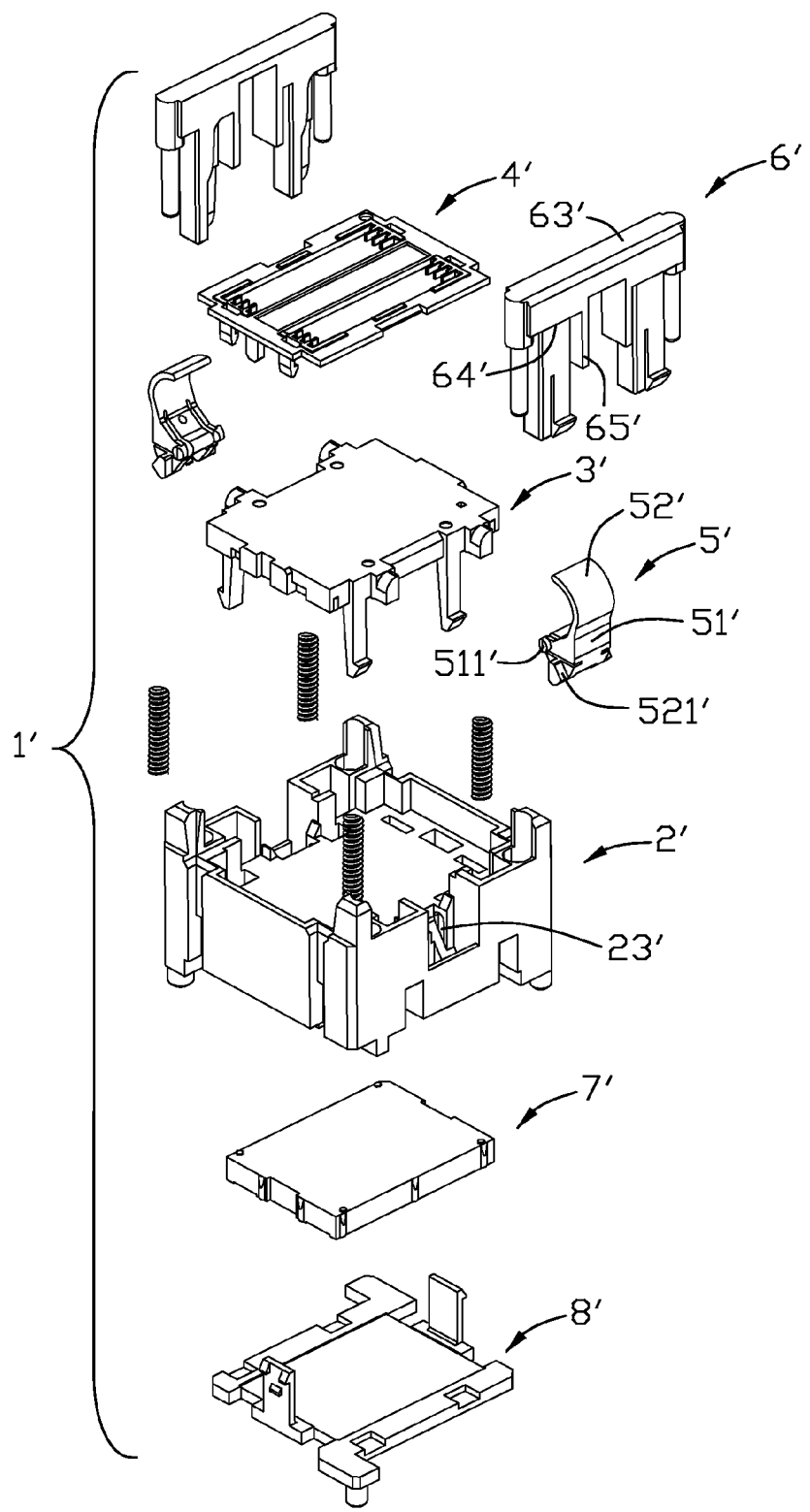
FIG. 1 is an explored, perspective view of a related socket.

Reference will now be made in detail to the preferred embodiments of the present invention.

Referring to FIG. 2 to FIG. 6, a burn-in socket 1 in accordance with present invention for electrically connecting an IC package 7 to a printed circuit board, comprise a base 2, a sliding plate 3, a pair of latches 4 pivotally assembled on two sides of the base 2 to position the IC package 7 on the sliding plate 3, a lid 5 mounted on the base 2 for urging the latches 4 and a bottom board 6 assembled on the bottom of the base 2.

The base 2 has a rectangle configuration, and comprises two opposite sidewalls 21 and a bottom wall 22, a cavity 25 is defined in the center of the base 2 for accommodating the sliding plate 3 and the bottom board 6. The cavity 25 has four guiding pins 251 disposed on four corners thereof, the guiding pins 25 land the sidewalls 21 cooperatively define a plurality of guiding slots 252 for the bottom board 6. The guiding slot 252 has a protrusion (not shown) therein for retaining the bottom board 6. The sidewall 21 defines a plurality of leading slots 23 on an out side surface thereof, the leading slot 23 has a locking clump 24 therein for retaining the lid 5, the sidewall 21 further has mounting holes 211 for receiving springs (not shown) on four corners thereof. The guiding pin 251 is formed with a pivoting hole 253 for retaining the latch 4 on the base 2. The base 2 has a pair of receiving slots 212 between the guiding pin 251 of each sidewall 21, the receiving slot 212 has a latching portion (not shown) for fastening the sliding plate 3.

The sliding plate 3 is attached to the base 2 along a top-to-bottom direction, and comprises a board-like main body 31, four position arms 32 extending downwardly from a bottom side of the main body 31 and four position walls 33 extending upwardly from the main body 31. The position wall 33 and the main body 31 together define a receiving space (not labeled) for receiving the IC package 7. The main body 31 has a plurality of contact channels 34 passing though the main body 31 from a part thereof between the position walls.

The position arm 32 has a clasp 321 on a free end thereof, which can latch with recess (not shown) defined on the base 2 to both movably assemble the sliding plate 3 on the base 2 and prevent the sliding plate 3 from removing from the base 2.

The latch 4 movably pivots to the base 2, and comprise a retaining portion 41 and a latching portion 42 extending forwardly from the retaining portion 41. The retaining portion 41 has a first shaft 411 on a bottom end thereof and near an inner side for engaging with the pivoting hole 253 of the base 2 to assemble the latch 4 on the base 2. The retaining portion 42 defines a through hole 412 on a top end thereof and near an out side, the through hole 412 extending upwardly and outwardly. The through hole 412 has a second shaft 413 for retaining the latch 4 to the lid 5. The second shaft 413 is brought by the lid 5 to move up and down in the through hole 412.

Figure 6:
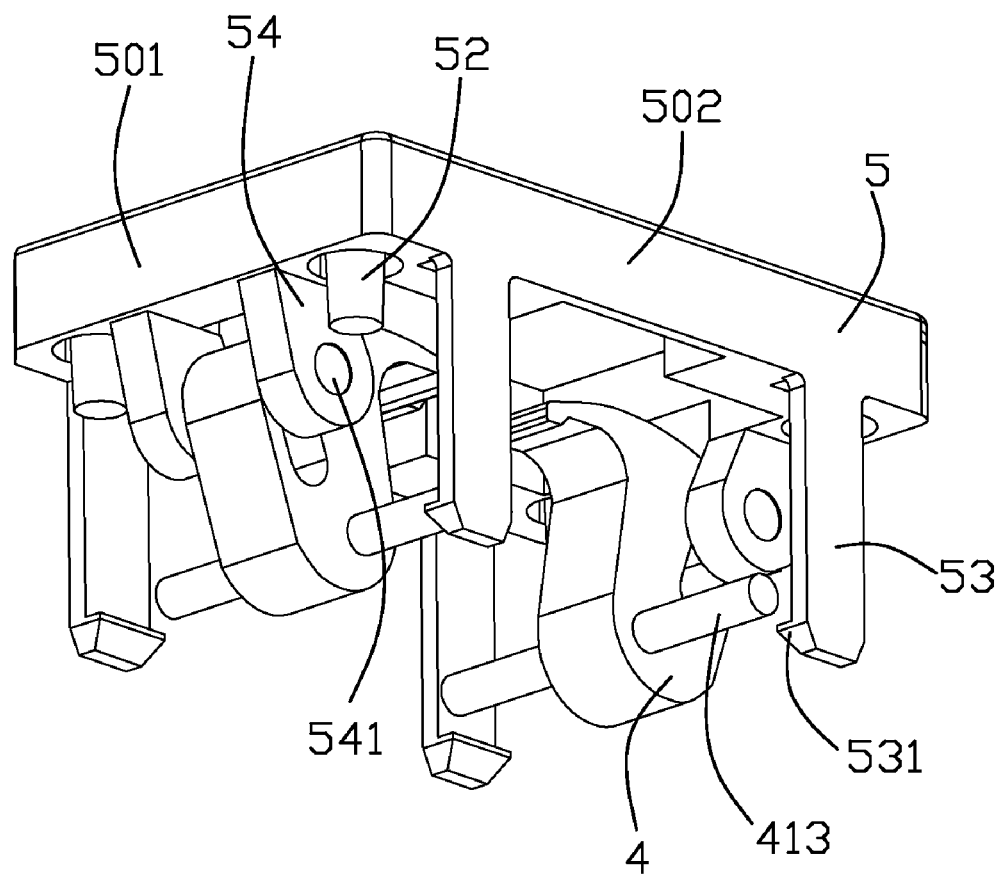
FIG. 6 is an assembled, perspective view of a lid with two latches of the burn-in socket shown in FIG. 3.

Referring to FIG. 6, the lid 5 is a rectangle frame configuration, comprises a frame 50 including a pair of short longitudinal sidewalls 501 and a pair of long transverse sidewalls 502. The longitudinal sidewalls 501 are parallel and opposite to each other, the transverse sidewall 502 connects the longitudinal sidewalls 501. The frame 50 has a pressing pole 52 on four corners thereof, which inserting downwardly into the mounting holes 211 of the base 2. The longitudinal sidewall has two pivoting portions 54 between the two pressing poles 52 and corresponding to the latch 4, the pivoting portion 54 defines a position hole 541 for receiving and retaining the second shaft 413 of the latch 4. The transverse sidewall 502 has a guiding leg 53 extending toward the base 2 and corresponding to the leading slot 23 of the base. The guiding leg 53 and the leading slot 23 of the base 2 cooperatively ensure that the lid 5 exactly move relative to the base 2 without excursion. The guiding leg 53 has a claw 531 on an end thereof to latch the locking clump 24 of the base 2 to assemble the lid 5 on the base 2.

Figure 2:
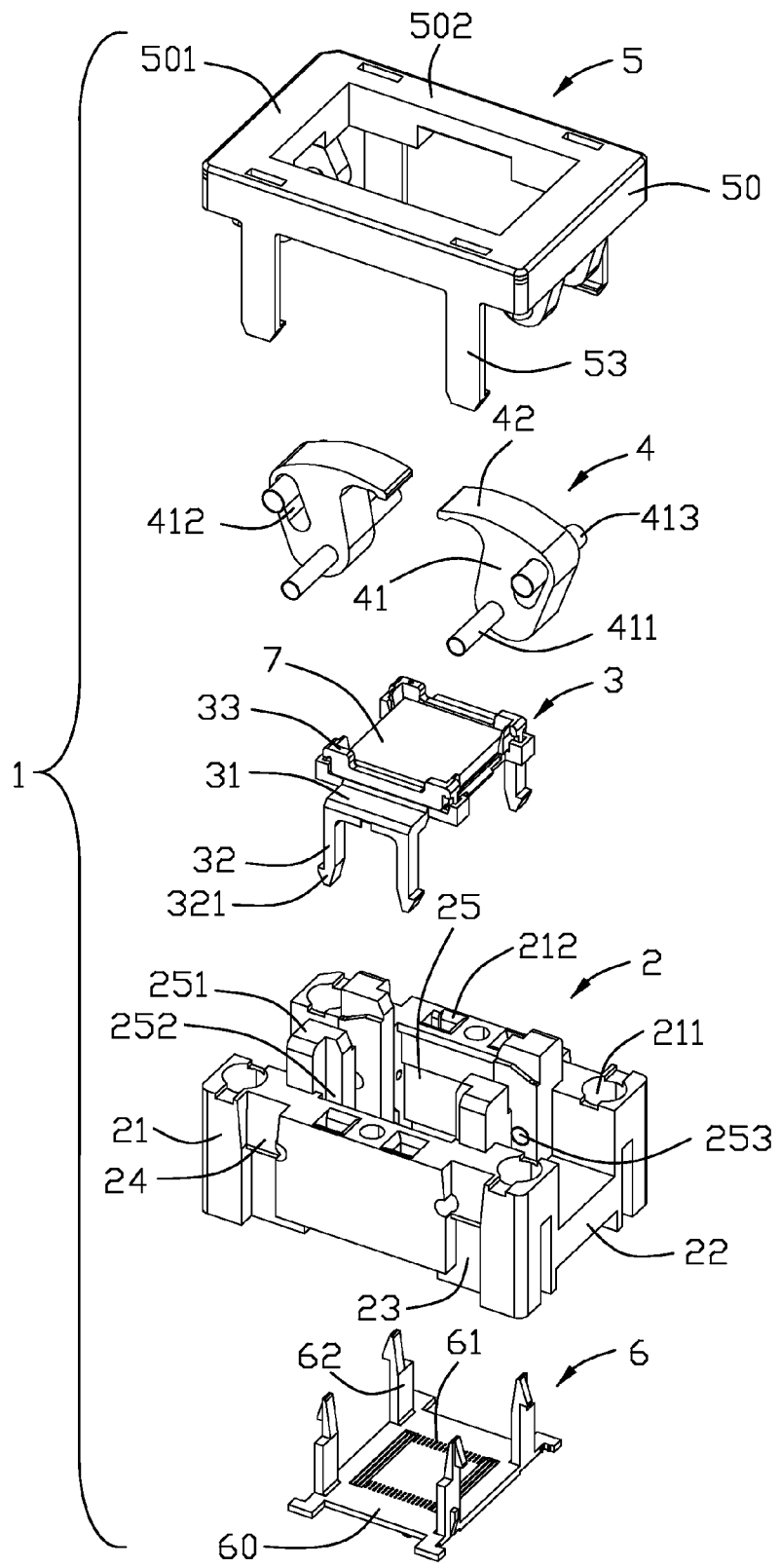
FIG. 2 is an explored, perspective view of a burn-in socket in accordance with a preferred embodiment of present invention.
Figure 3:
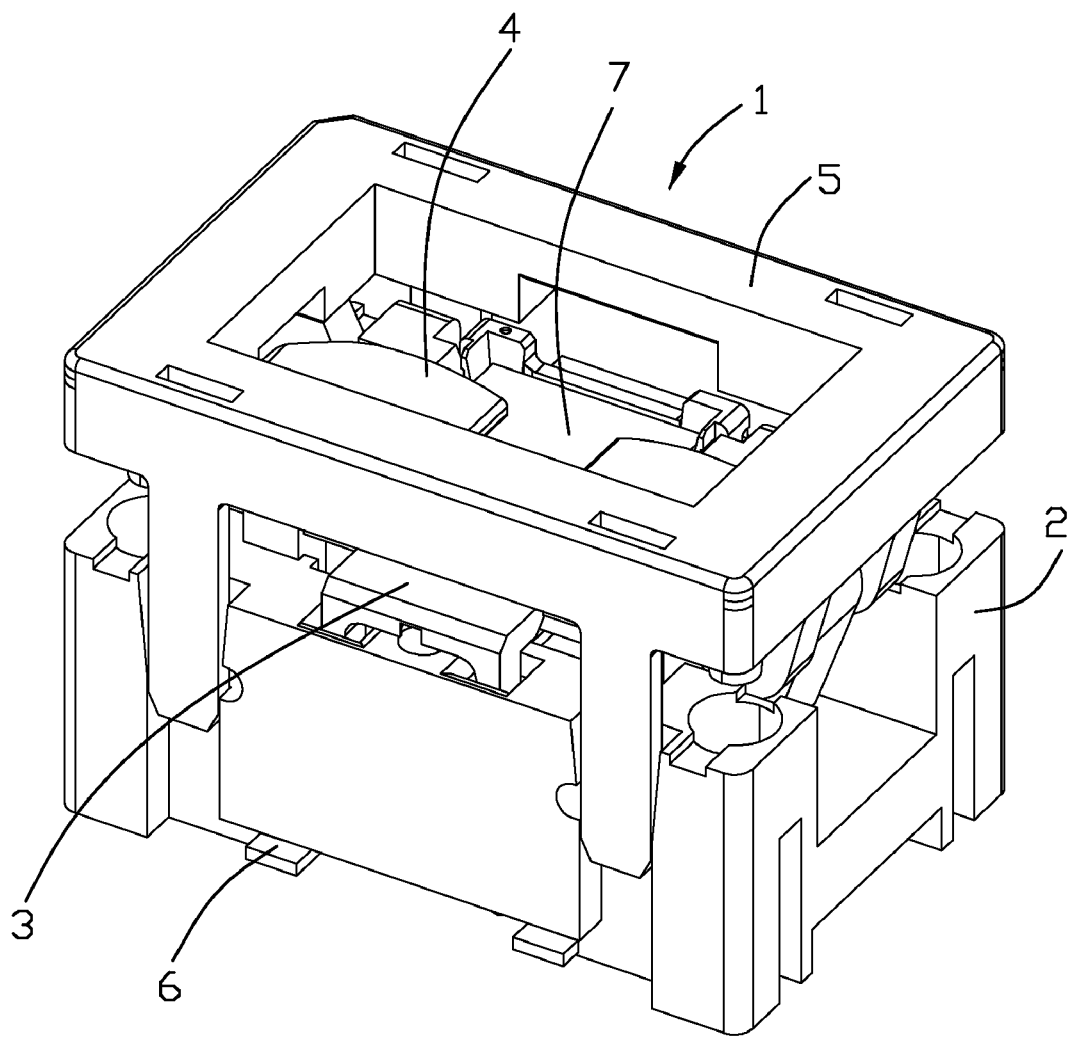
FIG. 3 is an assembled, perspective view of the burn-in socket in accordance with a preferred embodiment of present invention.
Figure 4:
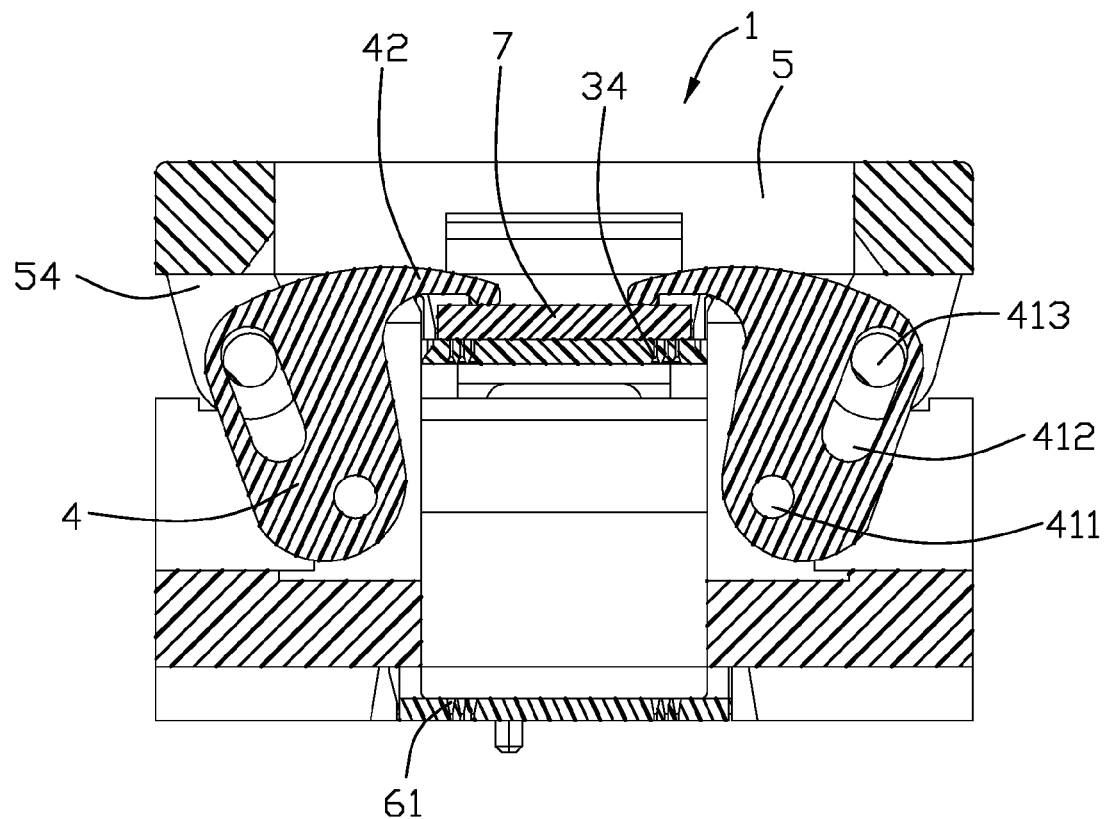
FIG. 4 is a sectional view of the burn-in socket shown in FIG. 3.
Figure 5:
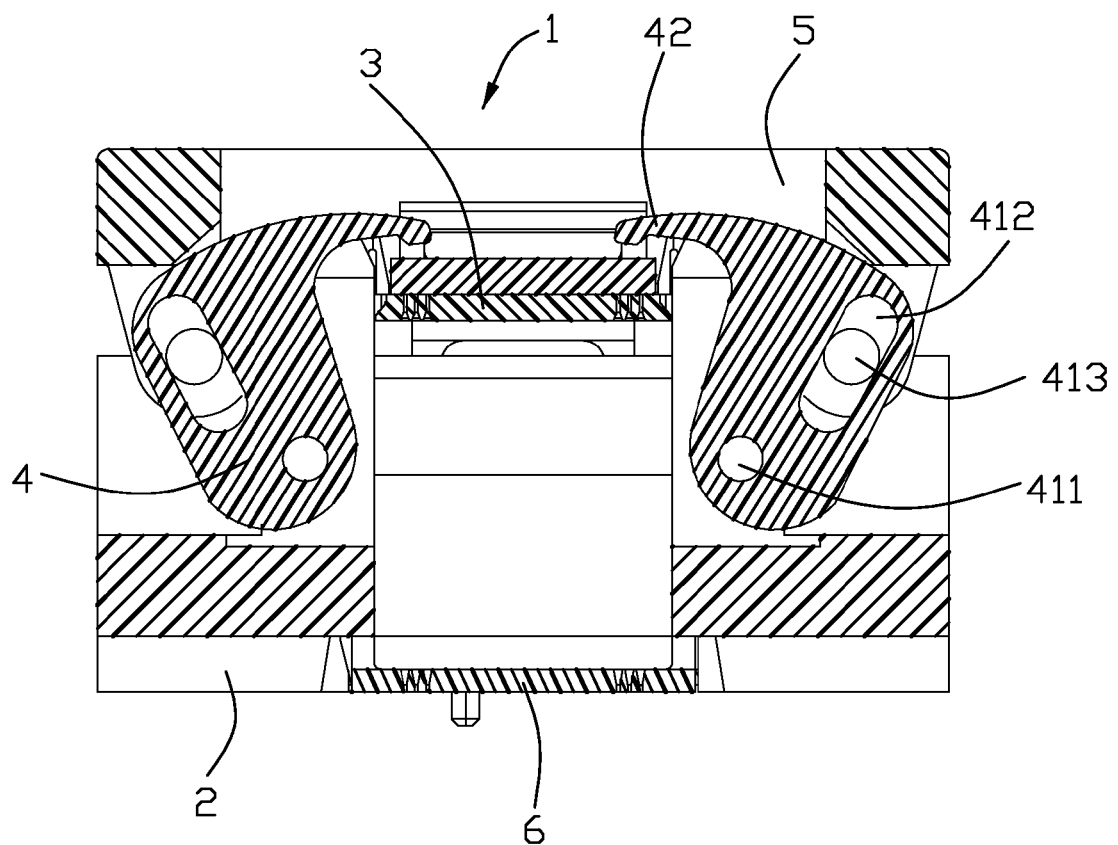
FIG. 5 is similar with FIG. 4.

Referring to FIG. 2 to FIG. 4, the bottom board 6 is assembled to the base 2 from a bottom side thereof. The bottom board 6 has a plane 60 which defines a plurality of apertures 61 on the center thereof corresponding to the contact channels 34 of the sliding plate 3 for the contact (not shown) passing through. The bottom board 6 has a plurality of hooks 62 with a claw (not shown) from four corners thereof and extending upwardly, the hooks 62 engage with the protrusions (not shown) in the guiding slots 252 of the base 2 to latch the bottom board 6 on the base 2.

When assembly, the sliding plate 3 is firstly mounted to the base f2 room the bottom side, the sliding plate 3 is retained on the base 2 by the clasps 321 of the position arms 32 of the sliding plate 3 engaging with the latching portion (not shown) in the receiving slot 212; then a top end of the contact (not shown) is received in the contact channel 34 of the sliding plate 3, then the bottom board 6 is assembled to the bottom of the base 2, a bottom end of the contact (not shown) is received in the aperture 61 of the bottom board 6, so that the contact (not shown) is retained in the base 2. The bottom board 6 is retained to the base 2 by the hooks 62 engaging with the protrusions in the guiding slot 252. Then the latch 4 is assembled to the base 2 by the first shaft 411, and the lid 5 is assembled to the base 2, the guiding leg 53 of the lid 5 is received in the guiding slot 23 of the base 2, the claw 531 of the guiding leg 53 latches with the locking clump 24 in the leading slot 23, finally, the latch 4 is linked to the lid 5 by the second shaft 413.

When the lid 5 is pushed downwardly by an outside force, the guiding leg 53 of the lid 5 slides downwardly in the leading slot 23, the second shaft 413 of the latch 4 linking with the lid 5 is forced to move up and down along the through hole 412, the pressing pin 52 of the lid 5 abuts the springs (not shown) received in the mounting hole 211, so the spring is compressed, the latching portion 42 of the latch 4 is forced by the second shaft 413 to open, so the IC package 7 can be put upon in the receiving space (not labeled) of the sliding plate 3. when the outside force is released, the lid 5 moves upwardly to an original position, the claw 531 of the guiding leg 53 latches with the locking clump 24, the burn-in socket 1 is in a close state, the latching portion 42 of the latch 4 is forced by the second shaft 413 to close and press a top surface of the IC package 7 to make conductive pads (not shown) of the IC package 7 electrically contact with contact (not shown), so that the IC package 7 electrically connects with the printed circuit board.

when being brought by the lid 5, the second shaft 413 can move up and down in the through hole 412 and actuates the latch 4 to rotate to open or close the latch, there is no need to dispose a spring under the latch to provide a restoring elastic force. That can also save a room under the latch 4 and simple a structure of the burn-in socket 1. Furthermore, a moving process between the lid 5 and the latch 4 can be reliably controlled, so the burn-in socket 1 can reliably electrically connects the IC package 7.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A burn-in socket, for electrically connecting an IC package to a printed circuit board, comprising:

base for receiving the IC package;

a lid assembled upon the base and being movable relative to the base; and a plurality of latches, each latch having a first shaft pivotally linking to the base and a second shaft pivotally linking to the lid, the latch defining a through hole extending aslant and receiving the second shaft, the second shaft being caused, in response to the lid moving up and down relative to the base, to move up and down in the through hole and forcing the latch to rotate;

the latch formed with a retaining portion and a latching portion extending from the retaining portion, and the through hole defined on a top end of the retaining portion and near an out side and extends upwardly and outwardly;

the base comprising four guiding slots with two sidewalls;

four guiding pins each defining a pivoting hole receiving the corresponding first shaft of the latch;

the sidewall of the base provided with a plurality of leading slots and locking clumps located in the leading slots, the lid having a plurality of guiding legs inserted into the corresponding leading slots, and each guiding leg having a claw engaging with the corresponding locking clump;

the lid having two pivoting portions, each pivoting portion defining a position hole receiving and retaining the corresponding second shaft of the latch; wherein when the second shaft is moved to one end of the through hole, the lid is rotated to a locking position for locking said electronic package in a receiving cavity; when the second shaft is moved to the other end of the through hole, the lid is rotated to an open position for unlocking the electronic package and allowing said electronic package to move upward from the receiving cavity.

2. The burn-in socket as described in claim 1, wherein, the first shaft is defined on a bottom end of the retaining portion and near an inner side.

3. The burn-in socket as described in claim 2, wherein the lid has two pressing poles on two sides of the pivoting portion.

4. The burn-in socket as described in claim 1, wherein said through hole is essentially straight.

5. The burn-in socket as described in claim 4, wherein the first shaft is defined on a bottom end of the retaining portion and near an inner side.

6. The burn-in socket as described in claim 5, wherein the base has said two sidewalls and a bottom wall, and the four guiding pins are formed on four corners of the base.

7. The burn-in socket as described in claim 6, wherein, a sliding plate assembled to the base from a top side.

8. The burn-in socket as described in claim 6, wherein the sidewall of the base has a pair of receiving slots between the two guiding pins for retaining the sliding plate.

9. The burn-in socket as described in claim 6, furthering comprising a bottom board assembled to the base from a bottom side and being movable relative to the guiding slot of the base.

10. The burn-in socket as described in claim 6, wherein the first shaft is defined on a bottom end of the retaining portion and near an inner side.

11. A burn-in socket, for electrically connecting an IC package to a printed circuit board, comprising:
    a base for receiving the IC package;
    a lid assembled upon the base and being movable relative to the base;
    a first shaft assembled to the base;
    a second shaft assembled to the lid; and
    a plurality of latches, each latch pivotally linking to the base by the first shaft, and pivotally linking to the lid by the second shaft, the latch defining a through hole receiving the second shaft, when the lid moving up and down relative to the base, the second shaft being brought to move up and down in the through hole and forcing the latch to rotate inwardly or outwardly;
    the base comprising four guiding slots with two sidewalls;
    four guiding pins each defining a pivoting hole receiving the corresponding first shaft of the latch;
    the sidewall of the base provided with a plurality of leading slots and locking clumps located in the leading slots, the lid having a plurality of guiding legs inserted into the corresponding leading slots, and each guiding leg having a claw engaging with the corresponding locking clump;
    the lid having two pivoting portions, each pivoting portion defining a position hole receiving and retaining the corresponding second shaft of the latch; wherein when the second shaft is moved to one end of the through hole, the lid is rotated to a locking position for locking said electronic package in a receiving cavity; when the second shaft is moved to the other end of the through hole, the lid is rotated to an open position for unlocking the electronic package and allowing said electronic package to move upward from the receiving cavity.

12. The burn-in socket as described in claim 11, wherein the latch is formed with a retaining portion and a latching portion extending from the retaining portion, the through hole is defined on a top end of the retaining portion and near an out side and extends upwardly and outwardly.

13. The burn-in socket as described in claim 12, wherein the first shaft is defined on a bottom end of the retaining portion and near an inner side.

14. A burn-in socket assembly for use with an electronic package, comprising:
    an insulative base defining a receiving cavity for receiving the IC package therein;
    an insulative lid assembled to the base and up and down moveable relative to the base;
    a plurality of latches, each latch pivotally mounted to the base about an immovable axis, and having a first shaft pivotally linking to the base about said immovable axis and a second shaft pivotally linking to the lid,
    a guiding/restriction mechanism including a through groove formed in one of said latch and said lid, and said second shaft formed on the other of said latch and said lid and restrainedly moving within and along said through groove;
    the base defining a plurality of pivoting holes each receiving the corresponding first shaft of the latch;
    two sidewalls of the base provided with a plurality of leading slots and locking clumps located in the leading slots, the lid having a plurality of guiding legs inserted into the corresponding leading slots, and each guiding leg having a claw engaging with the corresponding locking clump;
    the lid having two pivoting portions, each pivoting portion defining a position hole receiving and retaining the second corresponding shaft of the latch; wherein
    when the second shaft is moved to one end of the through groove, the lid is rotated to a locking position for locking said electronic package in the receiving cavity; when the second shaft is moved to the other end of the through groove, the lid is rotated to an open position for unlocking the electronic package and allowing said electronic package to move upward from the receiving cavity.

15. The burn-in socket assembly as claimed in claim 14, wherein said through groove is essentially straight.

16. The burn-in socket assembly as claimed in claim 14, wherein said end, said other end and the axis are not commonly aligned in one line.

17. The burn-in socket assembly as claimed in claim 14, wherein said through groove is formed in the latch and the shaft is formed on the lid.

18. The burn-in socket assembly as claimed in claim 17, wherein said end is farther from the axis than the other end.

* * * * *